(12) United States Patent
Jung et al.

(10) Patent No.: US 10,446,757 B2
(45) Date of Patent: Oct. 15, 2019

(54) SOLAR CELL

(71) Applicant: KABUSHIKI KAISHA TOSHIBA, Minato-ku (JP)

(72) Inventors: Hyangmi Jung, Yokohama (JP); Takeshi Gotanda, Yokohama (JP); Kenji Todori, Yokohama (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 159 days.

(21) Appl. No.: 14/938,066

(22) Filed: Nov. 11, 2015

(65) Prior Publication Data
US 2016/0141500 A1 May 19, 2016

(30) Foreign Application Priority Data
Nov. 19, 2014 (JP) .................................. 2014-235012

(51) Int. Cl.
*H01L 51/00* (2006.01)
*H01L 51/42* (2006.01)

(52) U.S. Cl.
CPC ...... *H01L 51/0047* (2013.01); *H01L 51/0035* (2013.01); *H01L 51/0036* (2013.01);
(Continued)

(58) Field of Classification Search
CPC ............. H01L 51/0035; H01L 51/0045; H01L 51/0046; H01L 51/0047; H01L 51/42;
(Continued)

(56) References Cited

U.S. PATENT DOCUMENTS

| 2008/0069971 A1* | 3/2008 | Keersmaecker ....... B82Y 15/00 427/555 |
| 2009/0188558 A1* | 7/2009 | Jen ......................... B82Y 10/00 136/256 |

(Continued)

FOREIGN PATENT DOCUMENTS

| JP | 2009-260324 | 11/2009 |
| JP | 2011-210880 | 10/2011 |

(Continued)

OTHER PUBLICATIONS

Steven K. Hau et al. "Effect of Chemical Modification of Fullerene-Based Self-Assembled Monolayers on the Performance of Inverted Polymer Solar Cells", ACS Applied Materials and Interfaces, vol. 2, No. 7, 2010, 11 pages.

(Continued)

*Primary Examiner* — Lindsey A Bernier
(74) *Attorney, Agent, or Firm* — Oblon, McClelland, Maier & Neustadt, L.L.P.

(57) ABSTRACT

An solar cell of an embodiment includes a first electrode, an electron transport layer containing a metal oxide, a self-assembled monolayer, a photoelectric conversion layer including a p-type semiconductor and an n-type semiconductor, and a second electrode. The self-assembled monolayer includes a fullerene-containing compound having a fullerene portion including a fullerene or a fullerene derivative, an absorption group to the metal oxide, and a bond group bonding the fullerene portion and the absorption group. The bond group contains a bivalent aromatic hydrocarbon group and a bivalent organic group which includes a carbon atom chain having 1 to 18 single-bonded carbon(s) or an atom chain in which a part of the carbon atom chain is substituted by at least one element selected from oxygen, nitrogen, and sulfur, as a main chain.

7 Claims, 1 Drawing Sheet

(52) U.S. Cl.
CPC ...... *H01L 51/0046* (2013.01); *H01L 51/4273* (2013.01); *H01L 51/0043* (2013.01); *H01L 51/4253* (2013.01); *H01L 2251/308* (2013.01); *Y02E 10/549* (2013.01)

(58) Field of Classification Search
CPC ............. H01L 51/4253; H01L 51/4235; H01L 51/4273; Y02E 10/549
See application file for complete search history.

(56) References Cited

U.S. PATENT DOCUMENTS

| | | |
|---|---|---|
| 2011/0018088 A1 | 1/2011 | Seike |
| 2011/0123812 A1* | 5/2011 | Reihs .................... B05D 1/185 428/426 |
| 2014/0319404 A1 | 10/2014 | Levin et al. |

FOREIGN PATENT DOCUMENTS

| | | |
|---|---|---|
| JP | 2013-89684 | 5/2013 |
| JP | 5375066 | 12/2013 |
| JP | 2014-524143 | 9/2014 |

OTHER PUBLICATIONS

Sukumaran Santhosh Babu et al. "Self-Assembled Gelators for Organic Electronics", Angew. Chem. Int. Ed., vol. 51, 2012, 11 pages.

Steven K. Hau, et al., "High performance ambient processed inverted polymer solar cells through interfacial modification with a fullerene self-assembled monolayer" Applied Physics Letters, vol. 93, 2008, 4 Pages (with Cover Page).

* cited by examiner

SOLAR CELL

CROSS REFERENCE TO RELATED APPLICATION

This application is based upon and claims the benefit of priority from Japanese Patent Application No. 2014-235012, filed on Nov. 19, 2014; the entire contents of which are incorporated herein by reference.

FIELD

Embodiments described herein relate generally to a solar cell.

BACKGROUND

An organic semiconductor is expected to be applied to a photoelectric conversion element such as an organic thin-film solar cell. For example, by using the organic semiconductor as a p-type semiconductor material, it becomes possible to apply an inexpensive coating method to formation of an active layer. On the other hand, in view of energy demand and $CO_2$ emission reduction, a solar cell is expected as one of clean energy having a small environmental load, and its demand is rapidly increasing. Though a silicon-based solar cell is a mainstream at present, cost curtailment thereof is difficult. As an inexpensive solar cell, a CdTe type solar cell is also known, but Cd being a harmful element is used, there is an apprehension that an environmental problem occurs. Under the circumstances, development of the organic thin-film solar cell is expected as a next-generation solar cell which is low in cost and harmless.

In order to heighten practicability of the organic thin-film solar cell, improvement of a power generation efficiency of the organic thin-film solar cell is strongly demanded. As a measure to improve the efficiency of the organic thin-film solar cell, it is known to apply a bulk hetero junction structure in which a mixture of an n-type semiconductor material and a p-type semiconductor material is used to a photoelectric conversion layer. For example, fullerene or its dielectric is used for the n-type semiconductor material and an organic semiconductor such as polythiophene and its dielectric is used for the p-type semiconductor material. Further, a photoelectric conversion efficiency of an organic thin-film solar cell is heightened by interposing an electron transport layer or a hole transport layer between a photoelectric conversion layer having a bulk hetero junction structure and an anode or a cathode, thereby to selectively flow an electron or a hole obtained in the photoelectric conversion layer to each pole.

A sufficient photoelectric conversion efficiency cannot be necessarily obtained only by the efficiency improvement measure of the organic thin-film solar cell as described above. Thus, it is proposed to interpose a self-assembled monolayer between an electron transport layer and a photoelectric conversion film. It is reported that introduction of the self-assembled monolayer shifts an energy level between an electrode and the photoelectric conversion layer, whereby a performance of an organic thin-film solar cell is improved. The self-assembled monolayer interposed between the electron transport layer and the photoelectric conversion film is required to be excellent itself in electron-accepting property and to be able to be formed uniformly and densely on a surface of the electron transport layer. However, a conventional self-assembled monolayer material cannot satisfy such required properties sufficiently. Thus, there are required a self-assembled monolayer material capable of improving a photoelectric conversion efficiency and a solar cell using the same.

DETAILED DESCRIPTION

According to one embodiment, there is provided a solar cell including: a first electrode; an electron transport layer disposed on the first electrode and containing a metal oxide; a self-assembled monolayer provided on the electron transport layer; a photoelectric conversion layer provided on the self-assembled monolayer and including a p-type semiconductor and an n-type semiconductor; and a second electrode separated from the first electrode through the photoelectric conversion layer. The self-assembled monolayer includes a fullerene-containing compound having a fullerene portion including a fullerene or a fullerene derivative, an absorption group to the metal oxide, and a bond group bonding the fullerene portion and the absorption group. The bond group contains a bivalent aromatic hydrocarbon group and a bivalent organic group which includes a carbon atom chain having 1 or more and 18 or less single-bonded carbon(s) or an atom chain in which a part of the carbon atom chain is substituted by at least one element selected from the group consisting of oxygen, nitrogen, and sulfur, as a main chain.

Figure 1:
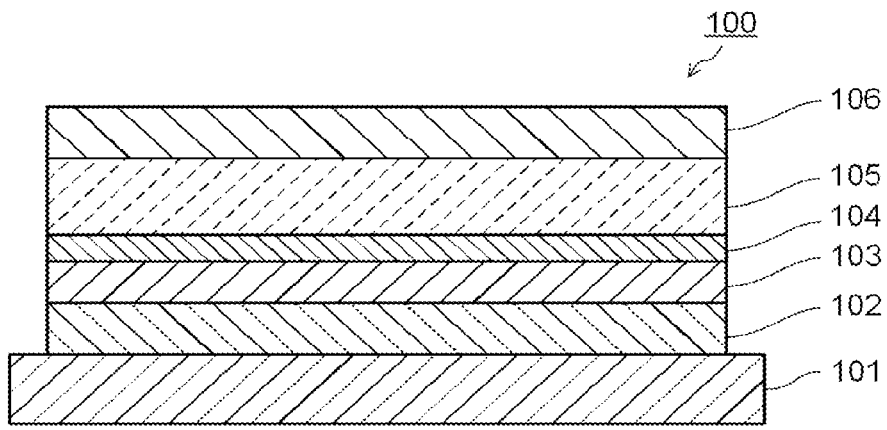
FIG. 1 is a cross-sectional view showing a first configuration example of a solar cell of an embodiment.
Figure 2:
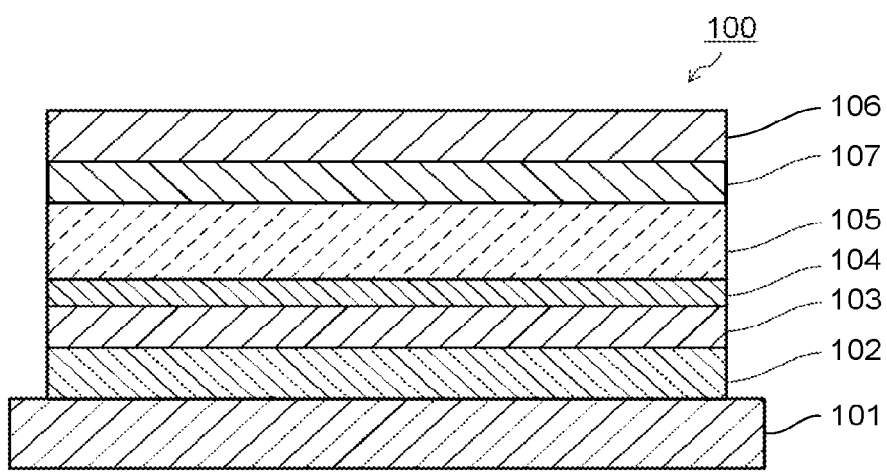
FIG. 2 is a cross-sectional view showing a second configuration example of the solar cell of the embodiment.

Hereinafter, a solar cell of an embodiment will be described. FIG. 1 shows an organic thin-film solar cell as the solar cell of the embodiment. The organic thin-film solar cell 100 shown in FIG. 1 has a first electrode 102 disposed on a substrate 101, an electron transport layer 103 disposed on the first electrode 102 and containing a metal oxide, a photoelectric conversion layer 105 disposed on the electron transport layer 103 via a self-assembled monolayer 104 and including a p-type semiconductor and an n-type semiconductor, and a second electrode 106 disposed on the photoelectric conversion layer 105. The second electrode 106 may be disposed on the photoelectric conversion layer 105 via a hole transport layer 107 as shown in FIG. 2. It suffices that the organic thin-film solar cell 100 has the photoelectric conversion layer 105 and the first and second electrodes 102, 106 separated through the photoelectric conversion layer 105, and the organic thin-film solar cell 100 may have an additional layer other than the electron transport layer 103 and the hole transport layer 107.

In the organic thin-film solar cell 100 shown in FIG. 1 and FIG. 2, to the photoelectric conversion layer 105 is irradiated light such as sunlight and illumination light from a substrate 101 side. When the photoelectric conversion layer 105 absorbs the irradiated light, charge separation occurs in a phase interface between the p-type semiconductor and the n-type semiconductor, whereby an electron and a hole being a counterpart thereof are generated. The first electrode 102 is an electrode to collect the electron generated in the photoelectric conversion layer 105. The second electrode 106 is an electrode to collect the hole generated in the photoelectric conversion layer 105. Though the first electrode 102 is disposed on the substrate 101 in FIG. 1 and FIG. 2, dispositions of the first electrode 102 and the second electrode 106 may be reversed. In such a case, the electron transport layer 103 is disposed on an electrode 102 side to collect the electron and the hole transport layer 107 is disposed on an electrode 106 side to collect the hole. Hereinafter, each portion above will be described.

The photoelectric conversion layer 105 in the solar cell element 100 of the embodiment has a function to carry out charge separation by irradiated light, and includes the p-type semiconductor (electron donor) and the n-type semiconductor (electron acceptor). For the p-type semiconductor included in the photoelectric conversion layer 105, there can be used polythiophene and a derivative thereof, polypyrrole and a derivative thereof, a pyrazoline derivative, an arylamine derivative, a stilbene derivative, a triphenylamine derivative, oligothiophene and a derivative thereof, polyvinyl carbazole and a derivative thereof, polysilane and a derivative thereof, a polysiloxane derivative having aromatic amine in a side chain or a main chain, polyaniline and a derivative thereof, a phthalocyanine derivative, porphyrin and a derivative thereof, polyphenylene vinylene and a derivative thereof, and polythienylene vinylene and a derivative thereof. The p-type semiconductor may be a copolymer of the above, and for example, a thiophene-fluorine copolymer, a phenylene ethynylene-phenylene vinylene copolymer, or the like may be used.

For the p-type semiconductor, there can be used polythiophene being a conductive macromolecule having a π conjugate structure and a derivative thereof. Polythiophene and the derivative thereof can secure an excellent stereoregularity, and has a comparatively high solubility to a solvent. Polythiophene and the derivative thereof are not limited in particular as long as being compounds having thiophene skeletal structures. As concrete examples of polythiophene and the derivative thereof, there can be cited polyalkylthiophene such as poly(3-methylthiophene), poly(3-butylthiophene), poly(3-hexylthiophene), poly(3-octylthiophene), poly(3-decylthiophene), and poly(3-dodecylthiophene), polyarylthiophene such as poly(3-phenylthiophene) and poly(3-(p-alkylphenylthiophene), polyalkylisothionaphthene such as poly(3-butylisothionaphthene), poly(3-hexylisothionaphthene), poly(3-octylisothionaphthene), and poly(3-decileisothionaphthene), polyethylenedioxythiophene, and so on. As the p-type semiconductor, there can be used a polythiophene derivative such as poly[N-9''-hepta-decanyl-2,7-carbazole-alto-5,5-(4',7'-di-2-thienyl-2',1',3'-benzothiadiazole] (PCDTBT) being a copolymer of carbazole, benzothiadiazole, and thiophene. By using polythiophene and the derivative thereof as the p-type semiconductor, it is possible to heighten a photoelectric conversion efficiency.

As the n-type semiconductor included in the photoelectric conversion layer 105, fullerene and a derivative thereof are suitably used. It suffices that the fullerene derivative has a fullerene skeletal structure, and a structure of fullerene is not limited in particular. As fullerene and the fullerene derivative, there can be cited fullerene such as $C_{60}$, $C_{70}$, $C_{76}$, $C_{78}$, and $C_{84}$, a fullerene oxide in which at least a part of carbon atoms of the above fullerene is oxidized, a compound obtained by modifying a part of the carbon atoms of the fullerene skeletal structure with an arbitrary functional group, a compound in which the functional groups bond to each other to form a ring, and so on. The fullerene derivative also includes a fullerene binding polymer. For the n-type semiconductor, it is preferable to use a fullerene derivative which has a functional group high in affinity to a solvent medium, thereby a solubility to a solvent being heightened.

As the functional group used for the fullerene derivative, there can be cited a hydrogen atom, a hydroxyl group, a halogen atom such as a fluorine atom and a chlorine atom, an alkyl group such as a methyl group and an ethyl group, an alkenyl group such as a vinyl group, a cyano group, an alkoxy group such as a methoxy group and an ethoxy group, an aromatic hydrocarbon group such as a phenyl group and a naphthyl group, an aromatic heterocyclic group such as a thienyl group and a pyridyl group, and so on. As concrete examples of the fullerene derivative, there can be cited a fullerene hydride such as $C_{60}H_{36}$ and $C_{70}H_{36}$, a fullerene oxide obtained by oxidizing $C_{60}$ or $C_{70}$, a fullerene metal complex, and so on. For the fullerene derivative, it is preferable to use [6,6]-phenyl $C_{61}$ butyric acid methyl ester (60PCBM), [6,6]-phenyl $C_{71}$ butyric acid methyl ester (70PCBM), indene-$C_{60}$ bisadduct (60ICBA), dihydronaphthyle-$C_{60}$ bisadduct (60NCBA), dihydronaphthyle-$C_{70}$ bisadduct (70NCBA), and so on. As unmodified fullerene, $C_{70}$ which has a high generation efficiency of an optical carrier is preferable.

The photoelectric conversion layer 105 has a thin-film laminated structure which has laminated p-type semiconductor layer and n-type semiconductor layer or a bulk hetero junction structure which has a mixture of a p-type semiconductor material and an n-type semiconductor material. Among the above, it is preferable to apply the bulk hetero junction structure capable of enlarging a phase interface between a p-type semiconductor and an n-type semiconductor. The photoelectric conversion layer 105 of a bulk hetero junction type has a microphase-separated structure of the p-type semiconductor material and the n-type semiconductor material. In the photoelectric conversion layer 105, a p-type semiconductor phase and an n-type semiconductor phase are phase-separated from each other, and form nano-order pn junction. When the photoelectric conversion layer 105 absorbs light, a positive charge (hole) and a negative charge (electron) are separated in the phase interface and transported to the electrodes 102, 106 through each semiconductor.

The photoelectric conversion layer 105 of the bulk hetero junction type can be formed by applying a solution made by dissolving a p-type semiconductor and an n-type semiconductor in a solvent. Therefore, it is possible to form an organic thin-film solar cell 100 which is low in cost and large in area by a printing method or the like by using an inexpensive device. A forming method of the photoelectric conversion layer 105 of the bulk hetero junction type is not limited in particular, and there is applied a spin coat method, a dip-coat method, a casting method, a bar code method, a roll coat method, a wire bar coat method, a spray method, a screen printing method, a gravure printing method, a flexographic printing method, an offset printing method, a gravure offset printing method, a dispenser coat method, a nozzle coat method, a capillary coat method, an ink-jet method, or the like. A method of combination of the above application methods may be applied to formation of the photoelectric conversion layer 105.

Kinds of the solvent in which the p-type semiconductor and the n-type semiconductor are to be dissolved are not limited in particular as long as being one capable of dissolving semiconductor materials uniformly. As the solvent, there can be cited, for example, an unsaturated hydrocarbon-based solvent such as toluene, xylene, tetralin, decalin, mesitylene, n-butylbenzene, sec-butylbenzene, and tert-butylbenzene, a halogenated aromatic hydrocarbon-based solvent such as chlorobenzene, dichlorobenzene, and trichlorobenzene, a halogenated saturated hydrocarbon-based solvent such as carbon tetrachloride, chloroform, dichloromethane, dichloroethane, chlorobutane, bromobutane, chloropentane, chlorohexane, bromohexane, and chlorocyclohexane, ethers such as tetrahydrofuran and tetrahydropyran. Among the above, the halogenated aromatic hydrocarbon-based solvent is preferably used. The above solvents can be used independently or mixedly. In forming the photoelectric conversion layer 105, it is preferable that a mixture ratio (n:p) of the n-type semiconductor and the p-type semiconductor in the solution is 1:0.1 to 1.

A thickness of the photoelectric conversion layer 105 is not limited in particular, but is preferable to be 10 nm to 1000 nm and is further preferable to be 50 nm to 250 nm. As a result that the thickness of the photoelectric conversion layer 105 is set to be 10 nm or more, uniformity of the layer is retained, so that short circuit becomes hard to occur. As a result that the thickness of the photoelectric conversion layer 105 is set to be 1000 nm or less, an internal resistance can be made small, and further, by a distance between the electrodes 102, 106 becoming small, diffusion of electric charges can be made good.

The first electrode 102 in the organic thin-film solar cell 100 of the embodiment is preferable to be constituted by a material suitable for collecting an electron. In the organic thin-film solar cell 100 of the embodiment, since light is irradiated from a first electrode 102 side, the first electrode 102 is preferable to have a light transmitting property. The first electrode 102 is preferable to transmit sunlight 40% or more, and is more preferable to transmit sunlight 70% or more. Thereby, light is transmitted through the first electrode 102 and it becomes easy to make light reach the photoelectric conversion layer 105. A transmittance of light can be measured by a common spectrophotometer and indicates an average transmittance for visible light (400 nm to 800 nm).

For the forming material of the first electrode 102, there is applied a conductive metal oxide such as an indium oxide, a zinc oxide, a tin oxide, an indium tin oxide (ITO), a fluorine-doped tin oxide (FTO), an indium-zinc oxide (TZO), and an indium-gallium-zinc oxide (IGZO), or metal such as lithium, sodium, potassium, calcium, magnesium, barium, strontium, zirconium, titanium, molybdenum, tungsten, manganese, cobalt, nickel, indium, aluminum, tin, gold, platinum, silver, and copper, an alloy including such metal, an oxide of such metal, or the like. The first electrode 102 is preferable to be formed of ITO, FTO, or the like. The first electrode 102 may be formed of polyaniline being an organic conductive polymer and a derivative thereof, polythiophene and a derivative thereof, or the like. The first electrode 102 may be a single layer film or may be a laminated film of materials with different work functions.

The first electrode 102 is formed by, for example, a vacuum deposition method, a sputtering method, an ion plating method, a plating method, a coating method, or the like. A film thickness of the first electrode 102 is not limited in particular, but is preferable to be 10 nm or more to 1 μm or less, and is further preferable to be 30 nm or more to 300 nm or less. When the film thickness of the first electrode 102 is too small, a sheet resistance becomes high. When the film thickness of the first electrode 102 is too large, the light transmittance is reduced and a flexibility is lowered, so that a crack or the like becomes easy to occur due to a stress. It is preferable that the film thickness of the first electrode 102 is selected so that both high light transmittance and low sheet resistance can be obtained. The sheet resistance of the first electrode 102 is not limited in particular, but normally is 10Ω/□ or more, is preferable to be 500Ω/□ or less, and is more preferable to be 200Ω/□ or less. In view of taking out a larger current, the sheet resistance of the first electrode 102 is preferable to be small.

The electron transport layer 103 has a function to block the hole generated in the photoelectric conversion layer 105 and to transport the electron selectively and efficiently to the first electrode 102 and a function to prevent disappearance of an exciton generated in an interface with the photoelectric conversion layer 105. As a forming material of the electron transport layer 103, there can be exemplified a metal oxide such as a zinc oxide (ZnO), a titanium oxide (TiO$_x$), and a gallium oxide (GaO$_x$). It suffices that the electron transport layer 103 is a layer containing a metal oxide, and may contain another material such as an alkali metal salt and an organic compound material, for example. The electron transport layer 103 is formed by, for example, a vacuum film forming method such as a sputtering method, a sol-gel method, a spin coat method, or the like. A film thickness of the electron transport layer 103 is preferable to be 0.1 nm or more to 400 nm or less, and is more preferable to be 1 nm or more to 50 nm or less. When the electron transport layer 103 is too thin, there is an apprehension that a taking-out efficiency of an electron cannot be improved sufficiently. When the electron transport layer 103 is too thick, there is an apprehension that the electron transport layer 103 acts as a series resistance component, damaging a property of an element. The electron transport layer 103 may be formed of nanoparticles or amorphous.

In the organic thin-film solar cell 100 of the embodiment, the photoelectric conversion layer 105 is formed on the electron transport layer 103 via the self-assembled monolayer 104. The self-assembled monolayer 104 is formed on the electron transport layer 103 and the photoelectric conversion layer 105 is formed on the self-assembled monolayer 104. The self-assembled monolayer 104 includes a fullerene-containing compound having a fullerene portion made up of fullerene or a fullerene derivative, an absorption group to the metal oxide, and a bond group bonding the fullerene portion and the absorption group. The bond group contains a bivalent aromatic hydrocarbon group and a bivalent organic group which includes a carbon atom chain having 1 or more and 18 or less single-bonded carbon(s) or an atom chain in which a part of the carbon atom chain is substituted by at least one element selected from the group consisting of oxygen, nitrogen, and sulfur, as a main chain. The bivalent aromatic hydrocarbon group is bonded to the fullerene portion, and the bivalent organic group is bonded to the bivalent aromatic hydrocarbon group and the absorption group.

In the fullerene-containing compound as a forming material of the self-assembled monolayer 104, it suffices that the fullerene portion is fullerene or a fullerene derivative having a fullerene skeletal structure. As the fullerene portion, there can be cited fullerene such as $C_{60}$, $C_{70}$, $C_{76}$, $C_{78}$, and $C_{84}$, a fullerene oxide in which at least a part of carbon atoms of fullerene is oxidized, a fullerene hydride, a fullerene metal complex, a fullerene derivative in which a carbon atom of a part of the fullerene skeletal structure is modified with an arbitrary functional group, and so on. Concrete examples of the functional group used in the fullerene derivative and the fullerene derivative having the functional group are similar to those of the fullerene derivative exemplified as the n-type semiconductor of the photoelectric conversion layer 105. For the fullerene portion in the fullerene-containing compound, fullerene or a fullerene derivative similar to those of the n-type semiconductor of the photoelectric conversion layer 105 can be used.

It suffices that the absorption group in the fullerene-containing compound is a substituent capable of bonding to a metal oxide, and is not limited in particular. As concrete examples of the absorption group to the metal oxide, there can be cited a carboxylic acid group (—COOH), a phosphonic acid group ($H_2PO_3$—), a phosphoric acid group ($H_2PO_4$)—, a sulfonic acid group (—$SO_3H$), a substituted or unsubstituted silyl group (—$SiR_3$), and a substituted or unsubstituted siloxane group (—$SiR_2$—O—$SiR_3$). R groups in the silyl group and the siloxane group are the same of different ones selected from hydrogen atoms, halogen atoms, and univalent hydrocarbon groups. Among the above, the absorption group is preferable to be the carboxylic acid group or the phosphonic acid group, in view of easiness of synthesis or an absorption to the metal oxide.

By providing the self-assembled monolayer 104 having the fullerene skeletal structure between the electron transport layer 103 and the photoelectric conversion layer 105, it becomes possible to control a morphology of the bulk hetero junction type photoelectric conversion layer 105 and an energy level between the photoelectric conversion layer 105 and the first electrode 102, to heighten a photoelectric conversion efficiency of the organic thin-film solar cell 100, for example. By disposing the self-assembled monolayer 104 having the fullerene skeletal structure, a density on an electron transport layer 103 side of fullerene or the fullerene derivative (n-type semiconductor) in the bulk hetero junction type photoelectric conversion layer 105 can be heightened. Therefore, the taking-out efficiency of the electron from the photoelectric conversion layer 105 is improved. Further, by the forming material of the self-assembled monolayer 104 having the absorption group, it is possible to heighten a formability of the self-assembled monolayer 104 having the fullerene skeletal structure to the electron transport layer 103 including the metal oxide.

The self-assembled monolayer 104 is required to be excellent in electron-accepting. The fullerene-containing compound being the forming material of the self-assembled monolayer 104 has the bivalent aromatic hydrocarbon group excellent in electron-accepting, the bivalent aromatic hydrocarbon group being interposed between the fullerene portion and the absorption group. It is preferable that the bivalent aromatic hydrocarbon group is a substituted or unsubstituted phenylene group (—$C_6R1_4$-: R1's are the same or different ones selected from hydrogen atoms, halogen atoms, and univalent hydrocarbon groups) or a substituted or unsubstituted naphthalenediyl group (—$C_{10}R1_6$-: R1's are the same or different ones selected from hydrogen atoms, halogen atoms, and univalent hydrocarbon groups). The above are excellent in electron-accepting and comparatively easy to be introduced between the fullerene portion and the absorption group. The bivalent aromatic hydrocarbon group is preferable to be the phenylene group (—$C_6H_4$—) or the naphthalenediyl group (—$C_{10}H_6$—), and is more preferable to be the phenylene group.

The fullerene-containing compound in which the fullerene portion and the absorption group are bonded via the bivalent aromatic hydrocarbon group such as a phenylene group is excellent in controllability of morphology of the photoelectric conversion layer 105 and formability onto the electron transport layer 103 including the metal oxide, but it is not possible to sufficiently heighten an orderliness, a denseness, or the like of the self-assembled monolayer 104 only by the fullerene-containing compound. In other words, due to a small distance between the fullerene portion and the absorption group, freedom of motion of the fullerene portion after absorption of the fullerene-containing compound by the electron transport layer 103 becomes low. The above becomes a factor to inhibit the orderliness of the fullerene-containing compound itself and the denseness after being formed into a film. As described above, with a film made up of the fullerene-containing compound having only the bivalent aromatic hydrocarbon group as a bond group, it is not possible to sufficiently obtain an effect of morphology control or the like of the electric conversion layer 105 by the self-assembled monolayer 104.

In the fullerene-containing compound as the forming material of the self-assembled monolayer 104 of the embodiment, the fullerene portion and the absorption group are bonded via the bivalent aromatic hydrocarbon group and the bivalent organic group having a chain structure in which the number of atoms of a main chain is 1 or more to 18 or less. In other words, the bivalent aromatic hydrocarbon group is bonded to the fullerene portion, and the absorption group is bonded to the bivalent aromatic hydrocarbon group via the bivalent organic group in which the number of atoms of the main chain is 1 or more to 18 or less. The fullerene portion and the absorption group are bonded via the bond group having the bivalent aromatic hydrocarbon group and the bivalent organic group having the chain structure in which the number of atoms of the main chain is 1 or more to 18 or less.

As a result of bonding the fullerene portion and the absorption group via the bivalent aromatic hydrocarbon group and the bivalent organic group in which the number of atoms of the main chain is 1 or more to 18 or less, it is possible to heighten freedom of motion of the fullerene portion after the absorption group is fixed to the metal oxide. Therefore, the self-assembled monolayer 104 having few defects as well as the high orderliness and denseness can be obtained. In other words, the self-assembled monolayer 104 of which fullerene portions are densely distributed can be obtained. By using such a self-assembled monolayer 104, a property of the organic thin-film solar cell 100 can be improved. If the bivalent organic group is not made to exist between the bivalent aromatic hydrocarbon group and the absorption group, the freedom of motion of the fullerene portions after the absorption group is fixed to the metal oxide is reduced.

In order to further heighten the freedom of motion of the fullerene portion, it is preferable that the number of the atoms of the main chain of the bivalent organic group is 2 or more. When the number of the atoms of the main chain of the bivalent group exceeds 18, an insulation performance of the fullerene-containing compound is heightened, and the property of the organic thin-film solar cell 100 is reduced. The number of the atoms of the main chain of the bivalent organic group is preferable to be 2 or more to 18 or less, and is more preferable to be 2 or more to 13 or less. The main chain of the bivalent organic group is constituted mainly by a carbon atom chain having single-bonded carbon(s), but a part of the carbon atom chain may be substituted by at least one element selected from the group consisting of oxygen, nitrogen, and sulfur. It suffices that the main chain of the bivalent organic group has a chain structure of a single-bonded straight-chain type or branching chain type, but the main chain of the bivalent organic group is preferable to have the straight-chain type structure.

As concrete examples of the bivalent organic group, there can be cited a substituted or unsubstituted alkylene group (—$(CR2_2)_n$-) in which the number of carbon(s) is 1 or more to 18 or less, a substituted or unsubstituted oxyalkylene group (—$O(CR2_2)_n$-) in which the number of carbon(s) is 1 or more to 17 or less, a substituted or unsubstituted alkylenedioxy group (—$O(CR2_2)_nO$—) in which the number of carbon(s) is 1 or more to 16 or less, and so on. A part of the carbon(s) of the main chains of the alkylene group, the oxyalkylene group, and the alkylenedioxy group may be substituted by at least one selected from ether oxygen (O), nitrogen (N), and sulfur (S). In the alkylene group, the oxyalkylene group, and the alkylenedioxy group, R2 groups being side chains are the same or different ones selected from hydrogen atoms, halogen atoms, and univalent hydrocarbon groups. As the univalent hydrocarbon group in the R2 group, there can be cited, for example, a substituted or unsubstituted alkyl group in which the number of carbon(s) is about 1 to 10, and a substituted or unsubstituted aryl group or heteroaryl group in which the number of carbon(s) is about 4 to 14.

The forming material of the self-assembled monolayer 104 is preferable to have a composition represented by the following formula (1).

(1)

In the formula (1), "Z" indicates a fullerene portion constituted by fullerene or a fullerene derivative, "X" indicates an absorption group, and "Y" indicates a bivalent organic group including a main chain having single-bonded 1 to 18 carbon(s) of a chain structure or a main chain in which a part of the above-described carbon(s) is substituted by at least one element selected from the group consisting of oxygen, nitrogen, and sulfur. Concrete examples of the fullerene portion Z, the absorption group X, and the bivalent organic group Y are as described above. The bivalent organic group Y is preferable to be the alkylene group, the oxyalkylene group, and the alkylenedioxy group, as described above, and further, is more preferable to be the oxyalkylene group.

The forming material of the self-assembled monolayer 104 is more preferable to have a composition represented by the following formula (2).

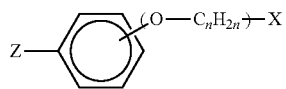

(2)

In the formula (2), "n" is an integer of 1 to 17. It is preferable that "n" is the integer of 1 to 12 and it is more preferable that "n" is the integer of 2 to 12.

The forming method of the self-assembled monolayer 104 onto the electron transport layer 103 is not limited in particular. For example, the monolayer 104 of the fullerene-containing compound having been self-assembled is formed by preparing a solution of the aforementioned fullerene-containing compound and immersing a substrate including the electron transport layer 10 in the solution or applying the solution onto the electron transport layer 103. To application of the solution of the fullerene-containing compound, there is applied a spin coat method, a casting method, a bar code method, a roll coat method, a wire bar coat method, a spray method, a screen printing method, a gravure printing method, a flexo printing method, an off-set printing method, a gravure off-set printing method, a dispenser coat method, a nozzle coat method, a capillary coat method, an ink jet method, or the like.

The second electrode 106 is preferable to be formed of a material suitable for collecting a hole. As a forming material of the second electrode 106, there can be cited, for example, metal such as platinum, gold, silver, copper, iron, tin, zinc, aluminum, indium, chromium, lithium, sodium, potassium, cesium, calcium, and magnesium, an alloy including such metal, an inorganic salt such as a lithium fluoride and a cesium fluoride, and a metal oxide such as a nickel oxide, an aluminum oxide, a lithium oxide, and a cesium oxide. The second electrode 106 may be a single layer film or a laminated film of materials with different work functions.

The second electrode 106 is formed by, for example, a vacuum deposition method, a sputtering method, an ion plating method, a plating method, a coating method, or the like. A film thickness of the second electrode 106 is not limited in particular, but is preferable to be 1 nm or more to 1 μm or less, is more preferable to be 1 nm or more to 500 nm or less, and is further preferable to be 10 nm or more to 300 nm or less. When the second electrode 106 is too thin, a sheet resistance becomes high. When the second electrode 106 is too thick, film-forming thereof requires a long time and there is an apprehension that a material temperature rises to damage the photoelectric conversion layer 105. The sheet resistance of the second electrode 106 is not limited in particular, butt is preferable to be 500Ω/□ or less and is more preferable to be 200Ω/□ or less. A lower limit value is not limited, but is normally 1Ω/□ or more.

The hole transport layer 107 has a function to block the electron generated in the photoelectric conversion layer 105 and to transport the hole selectively and efficiently to the second electrode 106 and a function to prevent disappearance of the exciton generated in the interface with the photoelectric conversion layer 105. As a forming material of the hole transport layer 107, there can be cited polythiophene, polypyrrole, polyacethylene, triphenylenediaminepolypyrrol, polyaniline, and so on, and a conductive polymer obtained by doping sulfonic acid or iodine to the above. Among the above, the conductive polymer obtained by doping sulfonic acid is preferable, and further, more preferable is PEDOT:PSS (poly(3,4-ethylenedioxythiophene)-poly(styrenesulfonate)) obtained by doping polystyrene sulfonic acid to a polythiophene derivative. For the hole transport layer 107, there can be used a metal oxide such as a tungsten oxide, a molybdenum oxide, a vanadium oxide, and a nickel oxide. The hole transport layer 107 is formed by, for example, a vacuum film-forming method such as a vacuum deposition method and a sputtering method, a sol-gel method, a spin coat method, or the like. A film thickness of the hole transport layer 107 is preferable to be 1 nm or more to 200 nm or less.

The organic thin-film solar cell 100 normally has the substrate 101 to be a support member. By forming the first electrode 102, the electron transport layer 103, the self-assembled monolayer 104, the photoelectric conversion layer 105, the hole transport layer 107 (formed as necessary), and the second electrode 106 in sequence on the substrate 101, the organic thin-film solar cell 100 is fabricated. A material of the substrate 101 is not limited in particular. As the substrate material, there can be cited an inorganic material such as quartz, glass, sapphire, and titania, an organic material such as polyethylene terephthalate, polyethylene naphthalate, polyethersulfone, polyimide, nylon, polystyrene, polyvinyl alcohol, vinyl chloride, polyethylene, polyvinylidene chloride, aramid, polyphenylene sulfide, polyurethane, polycarbonate, and epoxy resin, and so on. A form of the substrate 101 is not limited, and for example, a plate, a film, a sheet, or the like can be used. A thickness of the substrate 101 is not limited, either. The thickness of the substrate 101 is normally 5 μm or more to 20 mm.

EXAMPLES

Next, examples and evaluation results thereof will be described.

Example 1, Comparative Example 1

First, a glass substrate having an ITO electrode (first electrode) formed by a sputtering method is prepared. As a result that a ZnO precursor solution is spin-coated onto an ITO electrode forming-surface of the glass substrate in a nitrogen atmosphere and that drying is carried out in an atmosphere under a condition of 150° C.×5 minutes, the ZnO film (electron transport layer) with a thickness of 15 nm is formed. Next, a fullerene-containing compound (compound 1/example 1) having a composition represented by the following formula (3) and a fullerene-containing compound (compound 2/comparative example 1) having a composition represented by the following formula (4) are prepared. These fullerene-containing compounds are dissolved in isopropyl alcohol, and forming solutions of self-assembled monolayers are prepared respectively. By spin-coating the solutions each including the fullerene-containing compound (compound 1 or compound 2) onto the ZnO film, each of self-assembled monolayers is formed.

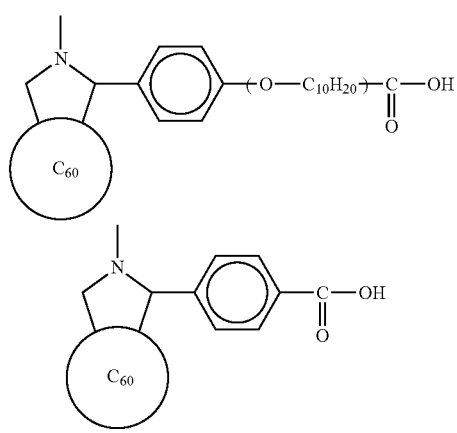

(3)

Next, there are mixed poly[4,8-bis(5-(2-ethylhexyl)thiophene-2-yl)benzo[1,2-b:4,5-b']dithiophene-co-3-fluorothieno[3,4-b]thiophene-2-carboxylate] (PCE-10) being a p-type semiconductor material and 70PCBM being an n-type semiconductor material so that a mass ratio becomes 1:2, and further, a mixture is dissolved in chlorobenzene including 3% diiodooctane. A mixed solution above of the p-type semiconductor material and the n-type semiconductor material is spin-coated onto the self-assembled monolayer of the example 1 or the comparative example 1 respectively, whereby a bulk hetero junction type photoelectric conversion layer with a thickness of about 100 nm is formed. Next, $V_2O_5$ films (hole transport layers) with a thickness of 2 nm and Ag films (second electrodes) with a thickness of 100 nm are formed onto the photoelectric conversion layers by a vapor deposition method, whereby an organic thin-film solar cell of the example 1 and an organic thin-film solar cell of the comparative example 1 are fabricated.

Light with an air mass (AM) of 1.5 G and an irradiance of 100 mW/cm² is irradiated to the organic thin-film solar cells of the example 1 and the comparative example 1 obtained as above, current-voltage properties between the ITO electrodes and the Ag electrodes at that time are measured. Table 1 shows measurement results (electromotive force, current density, conversion efficiency, parallel resistance, series resistance).

TABLE 1

| | | Property Evaluation Result | | | | |
|---|---|---|---|---|---|---|
| | Self-Assembled Monolayer | Electromotive Force [mV] | Current Density [mA/cm²] | Conversion Efficiency [%] | Parallel Resistance [Ω] | Series Resistance [Ω] |
| Example 1 | Chemical Compound 1 | 778 | 16.1 | 8.97 | 1226 | 5.9 |
| Comparative Example 1 | Chemical Compound 2 | 771 | 16.0 | 8.50 | 1050 | 5.8 |

As is obvious from Table 1, the conversion efficiency of the organic thin-film solar cell of the example 1 is 8.97% and the conversion efficiency is improved by 0.47% compared with that of the organic thin-film solar cell of the comparative example 1. This is considered to be because a denseness of the self-assembled monolayer is improved by using the fullerene-containing compound represented by the formula (3), whereby charge separation between the photoelectric conversion layer and the electron transport layer becomes easy, so that the parallel resistance and the current density are improved.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:
1. A solar cell comprising:
a first electrode;
an electron transport layer, provided on the first electrode so as to be in direct contact with the first electrode, comprising a metal oxide;
a self-assembled monolayer provided on the electron transport layer so as to be in direct contact with the electron transport layer;
a photoelectric conversion layer, provided on the self-assembled monolayer so as to be in direct contact with the self-assembled monolayer, including a p-type semiconductor and an n-type semiconductor; and a second electrode separated from the first electrode through the photoelectric conversion layer, wherein the self-assembled monolayer is provided between the electron transport layer and the photoelectric conversion layer, and comprises a fullerene-containing compound represented by the following formula (1),

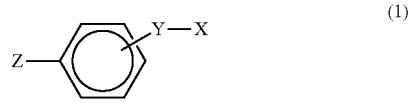

wherein Z indicates a fullerene or a fullerene derivative, X indicates an absorption group bonded to the metal oxide, and Y indicates a bivalent organic group which comprises a carbon atom chain having 10 to 18 single-bonded carbons or an atom chain in which a part of the carbon atom chain is substituted by at least one element selected from the group consisting of oxygen, nitrogen, and sulfur and which has 10 to 17 carbons, as a main chain.

2. The solar cell of claim 1, wherein the p-type semiconductor is an organic semiconductor, and the n-type semiconductor is a fullerene or a fullerene derivative.

3. The solar cell of claim 2, wherein the photoelectric conversion layer comprises a bulk hetero junction structure having a mixture of the organic semiconductor and the fullerene or the fullerene derivative which is the n-type semiconductor.

4. The solar cell of claim 1, wherein the bivalent organic group is a substituted or unsubstituted alkylene group in which a number of carbons is 10 to 18, a substituted or unsubstituted oxyalkylene group in which a number of carbons is 10 to 17, or a substituted or unsubstituted alkylenedioxy group in which a number of carbons is 10 to 16.

5. The solar cell of claim 1, wherein the absorption group is a carboxylic acid group, a phosphonic acid group, a phosphoric acid group, a sulfonic acid group, a substituted or unsubstituted silyl group, or a substituted or unsubstituted siloxane group.

6. The solar cell of claim 1, wherein the metal oxide comprises at least one selected from the group consisting of a zinc oxide, a titanium oxide, and a gallium oxide.

7. The solar cell of claim 1, further comprising:
a hole transport layer disposed between the photoelectric conversion layer and the second electrode.

* * * * *